US007486096B2

(12) United States Patent
Dhong et al.

(10) Patent No.: US 7,486,096 B2
(45) Date of Patent: Feb. 3, 2009

(54) METHOD AND APPARATUS FOR TESTING TO DETERMINE MINIMUM OPERATING VOLTAGES IN ELECTRONIC DEVICES

(75) Inventors: Sang H. Dhong, Austin, TX (US); Brian Flachs, Georgetown, TX (US); Gilles Gervais, Austin, TX (US); Charles R. Johns, Austin, TX (US); Brad W. Michael, Cedar Park, TX (US); Makoto Aikawa, Tokyo (JP); Iwao Takiguchi, Tokyo (JP); Tetsuji Tamura, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 11/554,712

(22) Filed: Oct. 31, 2006

(65) Prior Publication Data

US 2008/0100328 A1    May 1, 2008

(51) Int. Cl.
*G01R 31/26* (2006.01)
(52) U.S. Cl. ..................................... 324/765; 324/763
(58) Field of Classification Search ....................... None
See application file for complete search history.

(56) References Cited

U.S. PATENT DOCUMENTS

| 6,574,760 | B1* | 6/2003 | Mydill ..................... 714/724 |
| 6,834,359 | B2 | 12/2004 | Boehm |
| 7,072,728 | B2 | 7/2006 | Montano |
| 7,076,710 | B2 | 7/2006 | Knips |
| 2003/0204819 | A1 | 10/2003 | Matsumoto |
| 2008/0082873 | A1* | 4/2008 | Russell et al. ............... 714/721 |

OTHER PUBLICATIONS

Aharon—Test Program Generation for Functional Verification of PowerPC Processors in IBM, DAC (1995).
Benjamin—A Feasibility Study in Formal Coverage Driven Test Generation, DAC (1999).
Corno—Automatic Test Program Generation—a Case Study: the SPARC V8 (2004).
Doerre—The IBM ASIC/SoC methodology—A recipe for first-time success, IBM JRD (Nov. 2002).
Geist—Coverage-Directed Test Generation using Symbolic Techniques . . . , Proc FICOFMICAD (1996).
Haring—Blue Gene/L compute chip: Control, test and bring-up infrastructure, IBM JRD (Mar. 2005).
IBM—Cell Broadband Engine Architecture, Version 1.0, pp. 1-319 (Aug. 2005).

(Continued)

*Primary Examiner*—Vinh P Nguyen
(74) *Attorney, Agent, or Firm*—Diana Gerhardt; Mark P Kahler

(57) ABSTRACT

In one embodiment, a test system tests a device under test (DUT). The DUT includes an internal test controller that executes built-in self-test (BIST programs. Built-in self-test programs include array-based automatic built-in self-test programs, discrete and combinational logic built-in self-test programs, and functional architecture verification programs (AVPs). An external manufacturing system test controller manages the internal test controller within the DUT and determines minimum operating voltage levels for a power supply input voltage that supplies the DUT. A logic simulator provides a modeling capability to further enhance the development of minimum voltage power supply input operational values for the DUT.

20 Claims, 6 Drawing Sheets

OTHER PUBLICATIONS

Kapur—New Approach Moves Logic BIST Into Mainstream, EE Times (Oct. 14, 2002).

Kong—A Graph Grammar Approach to Software Architecture Verification and Transformation, Proc. 27th Int. Conf. on Computer SW and Applications (2003).

Medina—Verification on Configurable Processor Cores, DAC (2000).

Walter—Functional Verification of the IBM zSeries eServer z900 System, IEEE ICCD (2002).

XIV—Survey of Test Approaches in Industrial Microprocessors, Univ. Mass (2001).

* cited by examiner

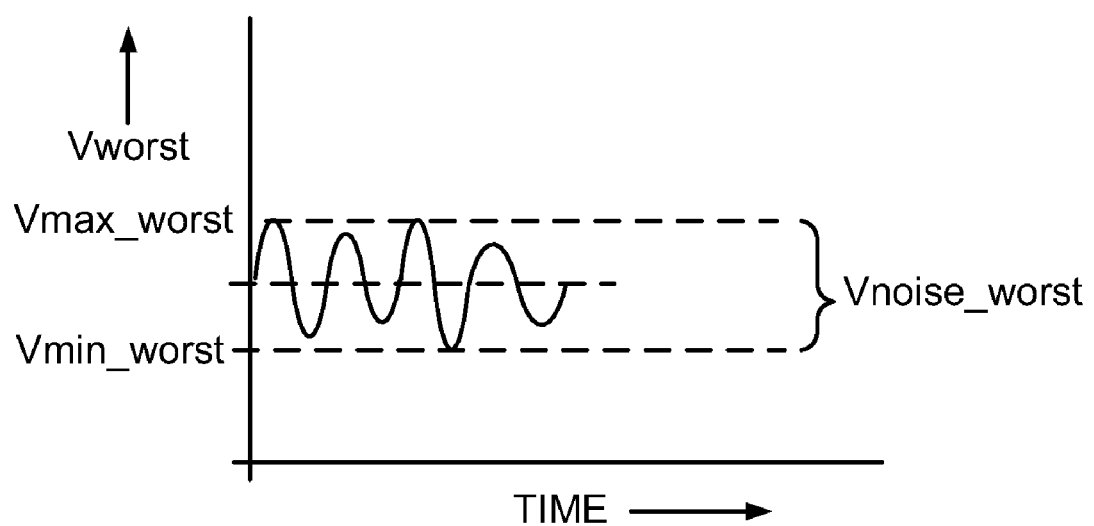

METHOD AND APPARATUS FOR TESTING TO DETERMINE MINIMUM OPERATING VOLTAGES IN ELECTRONIC DEVICES

TECHNICAL FIELD OF THE INVENTION

The disclosures herein relate generally to electronic circuits, and more particularly, to a methodology and apparatus for determining an acceptable operating voltage for an electronic circuit in an information handling system (IHS) or other system.

BACKGROUND

An electronic circuit may include a processor for processing, handling, communicating or otherwise manipulating information. Modern electronic circuits often take the form of integrated circuits (ICs) that incorporate several functional circuit blocks together on a common semiconductor die. Manufacturing test systems may monitor and separate integrated circuits (ICs) by functional capability such as the speed or frequency at which a circuit functions without error or failure. Manufacturing procedures may sort integrated circuits by specific operating parameters. For example, a test process may check integrated circuits for speed and discard integrated circuits that test slow. The test process may alternatively separate integrated circuits into categories of circuits, for example circuits useful in slower speed applications and circuits useful in higher speed applications. Manufacturing systems may also test for integrated circuit parameters other than speed or frequency response, for example thermal response, inducible noise sensitivity and immunity, and power supply voltage response. Integrated circuits often incorporate a built-in self-test (BIST) capability that is especially useful in testing complex integrated or electronic circuits. Built-in test (BIST) hardware or firmware in integrated circuits may employ complex internal test patterns, functional array and discrete logic test programs, and structured test techniques. Built-in test programs in an integrated circuit may test combinational and sequential logic, processor elements, memory, embedded logic structures and other elements of complex circuits.

Integrated circuits may exhibit faster execution capability by increasing the frequency of clocks within or external to the integrated circuit. A particular integrated circuit may also exhibit superior functionality in comparison with another integrated circuit, if the particular integrated circuit operates at the same frequency as the other integrated circuit, but at a lower voltage. By requiring less voltage, the particular integrated circuit requires less power than the other integrated circuit. Typically an integrated circuit that operates at higher frequencies than the average same-type integrated circuit without failure will also operate at a lower voltage than the average same-type integrated circuit. Determining critical device parametric values may require a complex test strategy and typically involves extensive testing over a large sampling of devices.

What is needed is a testing method and apparatus that addresses the problems faced by integrated circuit manufacturer described above.

SUMMARY

Accordingly, in one embodiment, a method is disclosed for determining the minimum operating voltage of a device under test (DUT). The method includes supplying voltage, by a power supply, to the DUT. The method also includes supplying, by a clock circuit, a clock signal exhibiting a predetermined frequency to the DUT. The method further includes varying, by a controller coupled to the power supply, the voltage of the power supply from a predetermined voltage value to lower and lower voltage values. The method also includes testing, by an internal test controller during the varying step, with a first test to determine a first minimum voltage at which the DUT successfully operates at the predetermined frequency. The method further includes testing, by an external test controller during the varying step, with a second test to determine a second minimum voltage at which the DUT successfully operates at the predetermined frequency. In one embodiment, the method also includes selecting the lower of the first minimum voltage determined in the internal testing step and the second minimum voltage determined in the external testing steps as the minimum operating voltage of the DUT.

In another embodiment, a test system is disclosed for determining the minimum operating voltage of a device under test (DUT). The test system includes a power supply that couples to the DUT and supplies voltage to the DUT. The test system also includes a clock circuit that couples to the DUT and supplies a clock signal exhibiting a predetermined frequency to the DUT. The test system further includes a controller that couples to the power supply and varies the voltage of the power supply from a predetermined voltage value to lower and lower voltage values. The test system still further includes an internal test controller, situated in the DUT, that conducts a first test to determine a first minimum voltage at which the DUT successfully operates at the predetermined frequency while the controller varies the voltage of the power supply. The test system also includes an external test controller, coupled to the internal test controller, that conducts a second test to determine a second minimum voltage at which the DUT successfully operates at the predetermined frequency. In one embodiment, the external test controller selects the lower of the first minimum voltage that the internal controller determines and the second minimum voltage that the external controller determines as the minimum operating voltage of the DUT.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 3 shows a timing diagram representing worst case power supply voltage noise for a built-in self-test of the DUT of FIG. 1.

DETAILED DESCRIPTION

Figure 1:
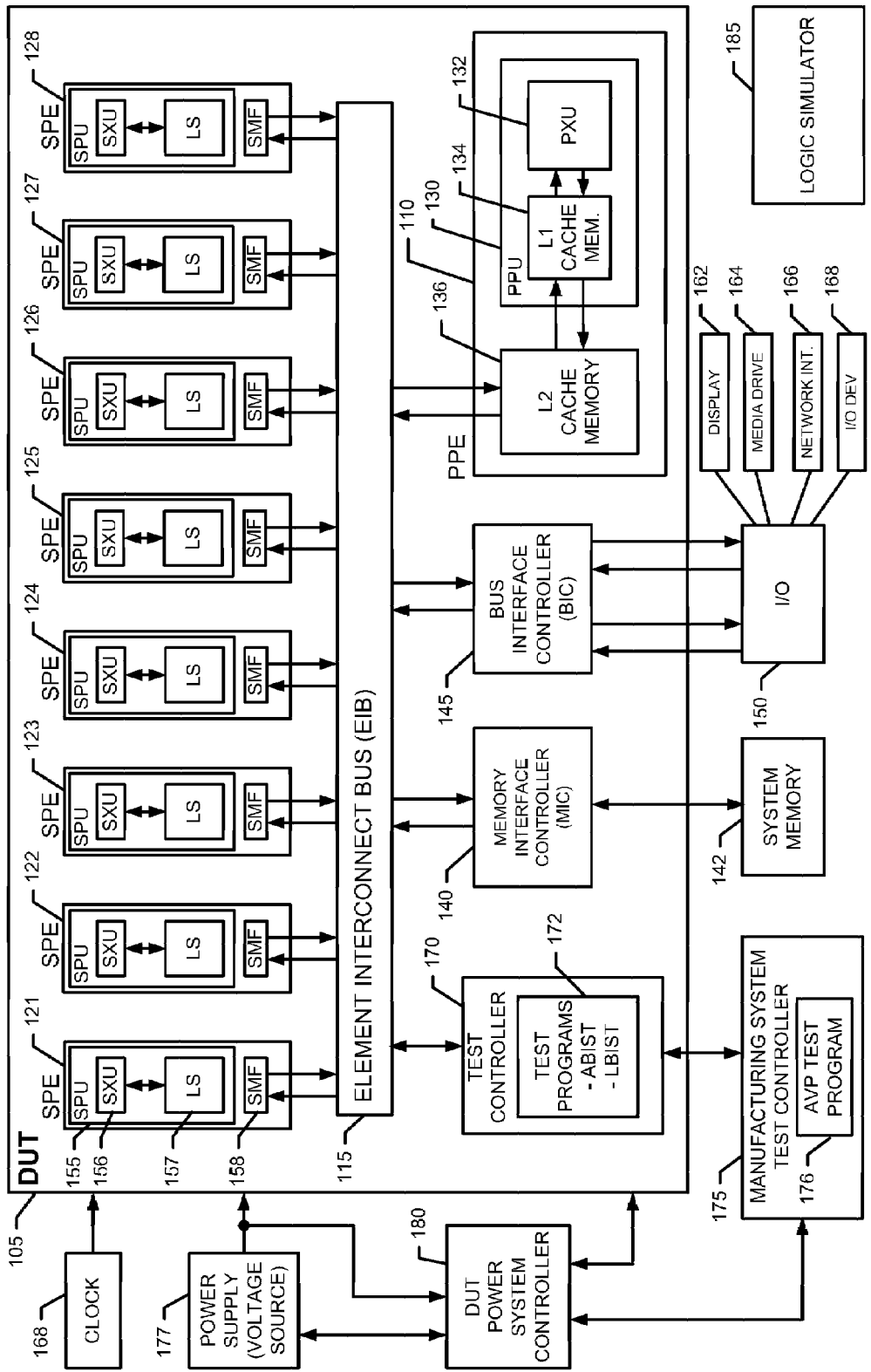
FIG. 1 shows a block diagram of the disclosed test system that includes a multi-core processor device under test (DUT).

Although the embodiment shown in FIG. 1 depicts a multi-core processor integrated circuit (IC), the disclosed testing methodology and apparatus will function with many different electronic circuits or devices. Electronic circuits may include integrated circuits (ICs), computer processors, single core processors, multi-core processors, synergistic processor units (SPUs), consumer audio electronics, communication devices and other complex electronic devices that benefit from testing.

An integrated circuit manufacturing process often produces devices that may exhibit a large variation in functional performance. A typical functional circuit tester may evaluate the capability of an electronic device or integrated circuit to operate at various clock frequencies. The highest frequency at which an integrated circuit operates without failure defines the unique parametric frequency characteristics of that particular circuit. Testing engineers and programmers may employ several different test programs to evaluate and test individual integrated circuits for device performance.

In a typical manufacturing environment, an automatic test system tests an integrated circuit by executing test programs repeatedly under specific parametric conditions while testers measure device parameters and perform pass/fail analysis. The automatic test system attempts to determine the maximum frequency capability of the integrated circuit or device under test (DUT). This maximum frequency capability of the DUT is useful in determining how high the clock rate can operate at a specific input power supply voltage for the particular DUT. Typically the manufacturing test system increases the frequency of the DUT during the test process, while holding the input power supply voltage constant, until the device fails to function. Unfortunately, this test methodology does not take into account all variables that relate to integrated circuit or DUT performance. Manufacturing test systems typically limit the number of input variables per test, such as input frequency and power supply voltage. Other variables such as power supply noise, and pattern testing or "use state" are typically not part of the manufacturing test.

In one aspect of the disclosed test methodology, users may desire to operate a collection of integrated circuit devices at a static frequency, namely the same operating frequency. For example, if one model of an electronic product includes a processor, it may be desirable that all instances of the particular model include a processor that operates at the same frequency. Under some circumstances it may be desirable to determine the lowest input operating power supply voltage for an electronic device or integrated circuit that operates at a particular same frequency. A useful relationship between input supply voltage and the frequency characteristics of the integrated circuit does not typically result from the test methodology above.

The disclosed electronic device functional test system and test methodology may determine an integrated circuit's or DUT's performance in a static frequency environment, namely an operating environment wherein the frequency of the DUT does not change. The device functional tester may also maintain the DUT frequency at a known state and lower the input supply voltage to the DUT. Moreover, lowering the input voltage to a DUT, and further evaluating at what voltage level the DUT remains in a fully functional state is a method to determine DUT input power supply voltage performance.

A device test may yield a particular device that exhibits an operational capability at a lower input voltage than the average input voltage distribution of similar devices. Moreover, such a device that exhibits the lower operating input voltage power supply performance represents a lower heat dissipation parameter for that device. The identified ability to operate such a device with lower power supply voltages offers significant overall performance improvement opportunities.

FIG. 1 shows a test system 100 as an information handling system (IHS) that includes a device under test (DUT) 105. In one embodiment, DUT 105 is a multi-core processor such as shown in the publication "Cell Broadband Engine Architecture, Version 1.0, by IBM Corp, Sony and Toshiba, Aug. 8, 2005, the disclosure of which is incorporated herein by reference in its entirety. In one embodiment, DUT 105 is a heterogeneous processor, namely a processor including at least one general processor unit having a first instruction set and at least one other processor unit having an architecture and instruction set different from that of the general purpose processor. For example, the other processor may be a specialized processor unit or special purpose processor. In the particular embodiment shown in FIG. 1, DUT 105 includes a general processor unit 110, for example a Power PC Processor Element (PPE) employing a RISC instruction set, coupled via an element interconnect bus (EIB) 115 to eight synergistic processor elements (SPEs) employing a single instruction multiple data (SIMD) instruction set, namely processors 121, 122, ... 128. More particularly, PPE 110 includes a PowerPC processor unit (PPU) 130 having a processor unit (PXU) 132 that couples to an L1 cache memory 134 therein. An L2 cache memory 136 couples to L1 cache memory 134 as shown. A memory interface controller 140 couples EIB 115 and to a system memory 142. A bus interface controller (BIC) 145 couples DUT 105 to an I/O hub 150. I/O hub 150 couples to I/O devices such as a display 162, a media drive 164, a network interface 166, or other I/O device 168. In one embodiment, media drive 164 provides non-volatile storage for an operating system, software applications and other information. Network interface 166 provides wired or wireless communications between IHS 100 and other IHSs. In one embodiment, DUT 105 together with I/O hub 150, display 162, media drive 164, network interface 166 and I/O devices 168 together form an information handling system (IHS) within test system 100.

In one embodiment, PPE 110 controls processor tasks and SPEs 121, 122, ... 128 perform data intensive processing tasks that PPE 110 assigns. SPEs 121-128 are available to act as accelerators for tasks such as information compression, information decompression as well as other information handling tasks. A representative SPE 121 includes at least one synergistic processor unit (SPU) 155. SPU 155 includes a synergistic processing unit (SXU) 156 that couples to local storage (LS) 157. SPU 155 further includes at least one synergistic memory flow control (SMF) 158 that couples to element interconnect bus (EIB) 115 as shown. Remaining SPEs 122, 123 ... 128 include structures similar to those of representative SPE 121. In one embodiment, DUT 105 is a heterogeneous multi-core processor, namely a processor including 2 different types of processor units. In one embodiment, PPE 110 is a general purpose flexible processor core whereas representative SPE 121 may be more specialized in the sense that SPE 121 does not handle external interrupts and it does not handle full addressability to memory. In other words, SPE 121 may access its own local store memory 157, but must request PPE 110 for assistance in accessing system memory 142. While FIG. 1 shows test system 100 as including a Cell processor as the device under test (DUT) 105, in actual practice many different types of electronic circuits and integrated circuits are usable as DUT 105. For example, the disclosed testing methodology and apparatus applies also to DUTs such as single core processors, multi-core processors, digital signal processors (DSPs), controllers, microcontrollers, communication circuits, application specific integrated circuits (ASICS) as well as other complex electronic circuits and devices for which operational parameter testing is desirable. A clock circuit 168 provides a clock signal to DUT 105. In one embodiment, the frequency of the clock signal is static or fixed at a predetermined frequency while test system 100 conducts tests on DUT 105.

DUT 105 includes an internal test controller 170, namely a test controller internal to DUT 105, that employs one or more test programs 172. Test controller 170 couples to element interconnect bus (EIB) 115. Test controller 170 also couples to multiple internal devices or data nodes (not shown) in DUT 105 for which testing is desirable. A data node represents a connection point, trace, connector, signal trace, or discrete circuit element within DUT 105 where a physical connection can be made typically for purposes of reading or writing test data. The test controller 170 is typically a functional element of the electronic circuit of the device under test DUT 105. Moreover, test controller 170 is an integral component of the circuitry within DUT 105. Test controller 170 generates internal signals to write data into various data nodes within DUT 105. Test controller 170 also reads data from various data nodes within existing circuit functions of DUT 105. Test controller 170 further reads data nodes within DUT 105 and evaluates the read results under test software program control, namely control by test programs 172. Test data nodes for read and write access by test controller 170 can be any signal, trace or connection point within DUT 105 that the test controller may wish to provide input data to or receive output data from.

Test controller 170 may initiate built-in test (BIST) programs within the test programs 172, more specifically, an automatic built-in self-test (ABIST) program. The ABIST program exercises internal arrays within DUT 105 in order to verify all or some of the functionality of DUT 105. The ABIST program may employ a pattern generator and state machine to automatically create data patterns for input into various array test nodes of DUT 105. By pattern analysis and through previous test results, the ABIST program can predict the resultant data at output test nodes within the DUT and thereby generate a pass/fail result for the ABIST test. In one embodiment, the ABIST program within test programs 172 operates on array functions such as local memory, local caches, register arrays, and other bit array functions within DUT 105.

Test controller 170 may also run a logic built-in self-test (LBIST) program or programs within test programs 172 to further analyze the functionality of DUT 105. In one embodiment, the LBIST program tests the combinational and sequential logic functions of DUT 105. The primary operation of the LBIST test program is to inject data patterns in to the functional logic nodes of DUT 105 and read at various test nodes the resultant output of the data pattern(s). Test controller 170 compares the read test results of a DUT currently under test to the previous test results from known good or passing DUTs. Test controller 170 stores passing test signatures that derive from passing circuit device tests. As in the ABIST program above, the LBIST program ends in a pass or fail result for a particular DUT 105. In the case where both the ABIST and LBIST programs in test controller 170 do not completely test all functions within DUT 105, a manufacturing system test controller 175 external to DUT 105 may initiate an architecture verification program (AVP) 176 to provide further test analysis. A directed test program (DTP) is another name for an architecture verification program (AVP). External manufacturing system test controller 175 initiates the architecture verification program AVP to test specific areas of the DUT 105 that require discrete test program analysis. The AVP tests are especially important in cases where the ABIST and LBIST programs may bypass the test of a specific test node or nodes, or bypass the test of a specific functional element of DUT 105. As with ABIST and LBIST programs, the architecture verification program AVP results in a pass/fail response after testing the specific functional elements of DUT 105. Moreover, the manufacturing system test controller 175 may initiate the architecture verification program AVP 176 multiple times while directing a DUT power system controller 180 to vary the power supply input voltage of a power supply 177. Manufacturing system test controller 175 may thereby generate multiple pass/fail results at differing input power supply voltage inputs to DUT 105.

ABIST, LBIST, and AVP test programs may execute continuously in a loop and manufacturing system testers may adjust other variables, such as power supply voltage, while the test controller 170 evaluates the pass/fail test results. In one embodiment, it is important that the respective test programs all run at operational design frequencies for DUT 105. A typical or nominal DUT 105 will pass all three test programs at the operational design frequency of the device and at or above the nominal design power supply voltage of DUT 105. By running ABIST, LBIST and AVP tests repeatedly with DUT 105 running at a static frequency, the manufacturing system test controller 175 analyzes power supply voltage parameters. Power supply 177 provides supply voltage to DUT 105. A voltage minimum (Vmin) represents the minimum power supply voltage at which the DUT operates while still successfully passing the test program. More particularly, VminABIST represents the minimum operating power supply input voltage at which DUT 105 successfully operates during execution of the ABIST test program. Test system 100 and more specifically manufacturing system test controller 175 communicates commands to DUT power system controller 180 to vary the voltage that power supply 177 supplies DUT 105. Power supply 177 directly moves the power supply input voltage from a predetermined starting voltage value lower and lower to find the lowest voltage at which the DUT passes the ABIST test. This pass value is VminABIST. While varying the power supply voltage in this manner, clock circuit 168 maintains the frequency of the DUT clock signal at a predetermined static or fixed value. The predetermined starting voltage value is a voltage at which the DUT is known to successfully operate. As power supply 177 steps lower and lower in voltage, test system 100 repeats the ABIST, LBIST and AVP tests for each step. VminLBIST represents the minimum power supply input operating voltage at which DUT 105 successfully operates during execution of LBIST test program. Test system 100 varies the voltage that power supply 177 supplies DUT 105 from a predetermined voltage value lower and lower to find the lowest voltage at which the DUT passes the LBIST test. This pass value is VminLBIST. VminAVP represents the minimum power supply input voltage at which DUT 105 successfully operates during execution of AVP test program. Test system 100 varies the voltage that power supply 177 supplies DUT 105 from a predetermined voltage value lower and lower to find the lowest voltage at which the DUT passes the AVP test. This pass value is Vmin AVP. Test system 100 may conduct the ABIST, LBIST and AVP tests concurrently to reducing cycling of the voltage 177 from higher to lower values while conducting these tests.

Manufacturing system test controller 175 couples to test controller 170 of DUT 105 and DUT power system controller 180. Controllers 175 and 180 are external to DUT 105. DUT power system controller 180 couples to DUT 105 to provide power resources thereto. DUT power system controller 180 couples to power supply (voltage source) 177 to provide power supply voltage level change commands or requests thereto. Manufacturing system test controller 175 monitors the input power supply voltages to DUT 105 through DUT power system controller 180 and evaluates the power supply voltage level and relative noise parameters as part of the testing methodology. Manufacturing system test controller 175 may also alter the output of DUT power system controller 180 during a test program such as ABIST, LBIST and AVP to test various power supply voltages. Manufacturing system test controller 175 initiates the ABIST and LBIST test programs resident in test controller 170 and the AVP test program 176 and evaluates the resultant pass/fail and power supply voltage characteristics of each test. In one embodiment, test system 100 includes a logic simulator 185 that represents a software mechanism capable of modeling DUT 105 and executing comprehensive simulation test patterns including ABIST, LBIST and AVP test simulation programs. The combination of built-in test programs 172 within test controller 170 provides an extensive test capability for DUT 105. Moreover, the power supply voltage and noise monitoring capability of manufacturing system test controller 175 in conjunction with test controller 170 provides extensive test data for analysis. The software emulation capability of logic simulator 185 provides yet another resource for analysis of the DUT 105. When test system 100 conducts testing such as ABIST, LBIST and AVP tests, test system 100 operates in a "test mode" as distinguished from the "normal functional or operational mode" discussed below.

Figure 2A:
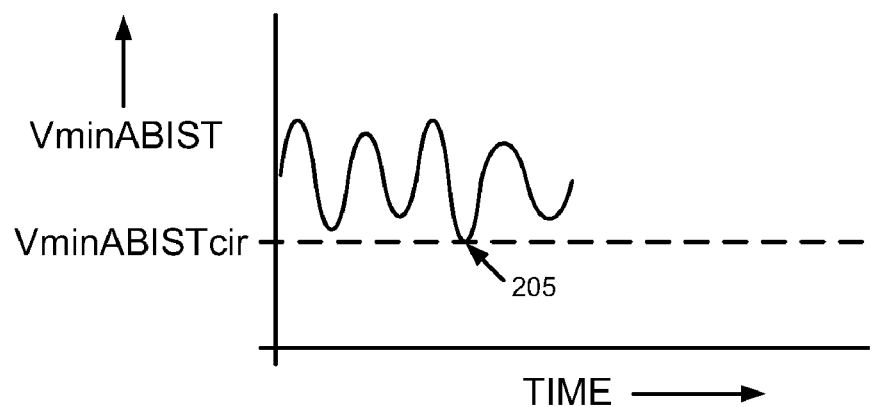
FIG. 2A shows a timing diagram of the power supply voltage for an automatic built-in self-test (ABIST) of the DUT of FIG. 1.
Figure 2B:
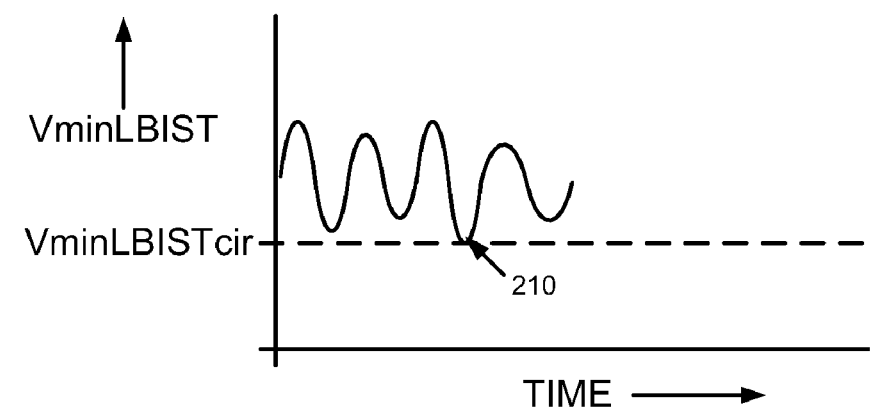
FIG. 2B shows another timing diagram of the power supply voltage for a logic built-in self-test (LBIST) of the DUT of FIG. 1.
Figure 2C:
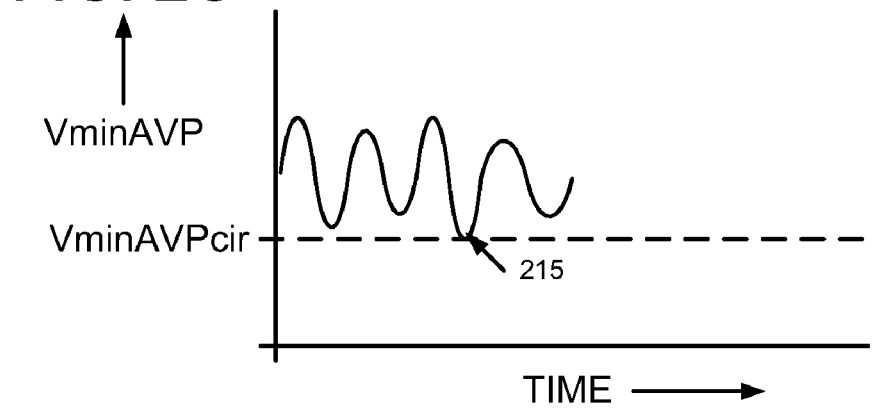
FIG. 2C shows another timing diagram of the power supply voltage for a architecture verification program (AVP) of the DUT of FIG. 1.

FIGS. 2A-2C show multiple representative power supply voltage waveforms over time for the DUT 105 of FIG. 1. Due to noise or other artifacts in the supply voltage that supply 177 generates, the minimum voltage, VminABIST, at which a particular DUT passes the ABIST test varies over time. In a similar manner, the minimum voltage, VminLBIST at which a particular DUT passes the LBIST test varies over time. Likewise, the minimum voltage, VminAVP at which a particular DUT passes the AVP test varies over time.

FIG. 2A depicts the minimum power supply voltage VminABIST from supply 177 that corresponds to the particular voltage step for which DUT 105 still passes the ABIST test as test controller 170 steps the power supply voltage lower and lower over time. FIG. 2A shows VminABIST values on the vertical axis and time on the horizontal axis. The amplitude of the voltage that FIG. 2A depicts varies due to noise that test system 100 induces in the voltage of power supply 177. An ideal power supply without noise would result in a horizontal line waveform in FIG. 2A. However, in this embodiment, the testing activities consider power supply noise to reflect real world operation. Test controller 170 runs the ABIST test program of programs 172 repeatedly over time while manufacturing system test controller 175 records the power supply 177 voltage over time, namely voltage data, as seen by DUT power system controller 180. Manufacturing system test controller 175 records this voltage data for each test wherein the ABIST test ends with a passing result. Manufacturing system test controller 175 discards the power supply input voltage data from ABIST tests wherein the test of DUT 105 fails to operate within acceptable design specifications. Thus, the resultant total waveform record in controller 175 reflects the collection of passing results, VminABIST, for DUT 105 during the ABIST test program execution. VminABISTcir is the lowest VminABIST voltage that manufacturing system test controller 175 records in the collection of passing ABIST tests. VminABISTcir represents the minimum safe operating power supply voltage for DUT 105 during the ABIST test program sequence. VminABISTcir thus represents the minimum of minimums, namely the lowest passing VminABIST value during a particular ABIST test sequence.

To review, manufacturing system test controller 175 reads a series of VminABIST values by repeating the ABIST test at various input power supply voltages in steps from high voltage to lower voltage, or vice versa, and therein logging the input power supply voltages relative to pass/fail status. Manufacturing system test controller 175 discards the test results for those supply voltages wherein DUT 105 fails to function or operate within design specifications. Controller 175 thus stores a collection of VminABIST values that correspond to different minimum supply voltage for which the DUT passes the ABIST test over time. The VminABIST waveform shown in FIG. 2A is the voltage waveform that just passes. The ABIST test for the next step lower in supply voltage corresponds to a failure, whereas the ABIST test for the previous step (the next step up) corresponds to a pass. The lowest power supply voltage read during the passing ABIST test runs defines the true circuit voltage or VminABISTcir value as shown by the dashed line in FIG. 2A and arrow 205. In other words, manufacturing system test controller 175 selects the minimum passing VminABIST value from all the ABIST tests that it conducts over time to determine the VminABISTcir value. The VminABISTcir value is thus the minimum of the minimum voltage, namely the minimum VminABIST value of the particular VminABIST waveform that just passes in the collection of VminABIST values that manufacturing system test controller 175 stores. Stated alternatively, VminABISTcir is the minimum voltage value of the supply voltage step that just passes as arrow 205 indicates, namely a lowest passing voltage.

FIG. 2B depicts the minimum power supply voltage VminLBIST from supply 177 that corresponds to the particular voltage step for which DUT 105 still passes the LBIST test as test controller 170 steps the power supply voltage lower and lower over time. FIG. 2B shows VminLBIST values on the vertical axis and time on the horizontal axis. The amplitude of the minimum power supply voltage that FIG. 2B depicts varies due to noise that test system 100 induces in the voltage of power supply 177. Test controller 170 runs the LBIST test program of programs 172 repeatedly over time while manufacturing system test controller 175 records the power supply 177 voltage over time, namely voltage data, as seen by DUT power system controller 180. Manufacturing system test controller 175 records this voltage data for each test wherein the LBIST test ends with a passing result. Manufacturing system test controller 175 discards the power supply input voltage data from LBIST tests wherein the test of DUT 105 fails to operate within acceptable design specifications. Thus, the resultant total waveform record in controller 175 reflects the collection of passing results, VminLBIST, for DUT 105 during the LBIST test program execution. VminLBISTcir is the lowest VminLBIST voltage that manufacturing system test controller 175 records in the collection of passing LBIST tests. VminLBISTcir represents the minimum safe operating power supply voltage for DUT 105 during the LBIST test program sequence. VminLBISTcir thus represents the minimum of minimums, namely the lowest passing VminLBIST value during a particular LBIST test sequence.

In review, manufacturing system test controller 175 reads a series of VminLBIST values by repeating the LBIST test at various input power supply voltages in steps from high voltage to lower voltage, or vice versa, and therein logging the input power supply voltages relative to pass/fail status. Manufacturing system test controller 175 discards the test results for those supply voltages wherein DUT 105 fails to function or operate within design specifications. Controller 175 thus stores a collection of VminLBIST values that correspond to different minimum supply voltage for which the DUT passes the LBIST test over time. The VminLBIST waveform shown in FIG. 2B is the voltage waveform that just passes. The LBIST test for the next step lower in supply voltage corresponds to a failure, whereas the LBIST test for the previous step (the next step up) corresponds to a pass. The lowest power supply voltage read during the passing LBIST test runs defines the true circuit voltage or VminLBISTcir value as shown by the dashed line in FIG. 2B and arrow 210. In other words, manufacturing system test controller 175 selects the minimum passing VminLBIST value from all the LBIST tests that it conducts over time to determine the VminLBISTcir value. The VminLBISTcir value is thus the minimum of the minimum voltage, namely the minimum VminLBIST value of the particular VminLBIST waveform that just passes in the collection of VminLBIST values that manufacturing system test controller 175 stores. Stated alternatively, VminLBISTcir is the minimum voltage value of the supply voltage step that just passes as arrow 210 indicates, namely a lowest passing voltage.

FIG. 2C depicts the minimum power supply voltage Vmin AVP from supply 177 that corresponds to the particular voltage step for which DUT 105 still passes the AVP test as test controller 170 steps the power supply voltage lower and lower over time. FIG. 2C shows VminAVP values on the vertical axis and time on the horizontal axis. The amplitude of the minimum power supply voltage that FIG. 2C depicts varies due to noise that test system 100 induces in the voltage of power supply 177. Test controller 170 runs the AVP test program of programs 172 repeatedly over time while manufacturing system test controller 175 records the power supply 177 voltage over time, namely voltage data, as seen by DUT power system controller 180. Manufacturing system test controller 175 records this voltage data for each test wherein the AVP test ends with a passing result. Manufacturing system test controller 175 discards the power supply input voltage data from AVP tests wherein the test of DUT 105 fails to operate within acceptable design specifications. Thus, the resultant total waveform record in controller 175 reflects the collection of passing results, VminAVP, for DUT 105 during the AVP test program execution. VminAVPcir is the lowest VminAVP voltage that manufacturing system test controller 175 records in the collection of passing AVP tests. Vmin AVPcir represents the minimum safe operating power supply voltage for DUT 105 during the AVP test program sequence. VminAVPcir thus represents the minimum of minimums, namely the lowest passing VminAVP value during a particular AVP test sequence.

To review, manufacturing system test controller 175 reads a series of VminAVP values by repeating the AVP test at various input power supply voltages in steps from high voltage to lower voltage, or vice versa, and therein logging the input power supply voltages relative to pass/fail status. Manufacturing system test controller 175 discards the test results for those supply voltages wherein DUT 105 fails to function or operate within design specifications. Controller 175 thus stores a collection of VminAVP values that correspond to different minimum supply voltage for which the DUT passes the AVP test over time. The VminAVP waveform shown in FIG. 2C is the voltage waveform that just passes. The LBIST test for the next step lower in supply voltage corresponds to a failure, whereas the AVP test for the previous step (the next step up) corresponds to a pass. The lowest power supply voltage read during the passing AVP test runs defines the true circuit voltage or VminAVPcir value as shown by the dashed line in FIG. 2C and arrow 215. In other words, manufacturing system test controller 175 selects the minimum passing Vmin AVP value from all the AVP tests that it conducts over time to determine the VminAVPcir value. The VminAVPcir value is thus the minimum of the minimum voltage, namely the minimum VminAVP value of the particular VminAVP waveform that just passes in the collection of VminAVP values that manufacturing system test controller 175 stores. Stated alternatively, VminAVPcir is the minimum voltage value of the supply voltage step that just passes as arrow 215 indicates, namely a lowest passing voltage.

By combining the results of all three test types, namely ABIST, LBIST, and AVP, the manufacturing system test controller 175 consolidates the minimum passing voltage data results from all three respective tests and generates a new overall or consolidated minimum voltage, Vmin, for the device under test DUT 105. As seen in EQUATION 1 below, Vmin represents the lowest operating power supply input circuit voltage for which all three test programs, namely ABIST, LBIST, and AVP tests indicate passing results.

$$\text{Vmin}=\text{MAX}(\text{VminABISTcir, VminLBISTcir, VminAVPcir}) \qquad \text{EQUATION 1}$$

In other words, Vmin is the maximum voltage in the set of VminABISTcir, VminLBISTcir, and VminAVPcir. The Vmin voltage is thus a selected maximum of minimums, namely the largest of VminABISTcir, VminLBISTcir and VminAVPcir. During execution of the ABIST, LBIST, and AVP test programs, DUT 105 generates a specific amount of power supply noise. The switching on and off of discrete circuits, loads or components within the DUT typically causes power supply noise. Device switching causes current load changes and the responding DUT power system controller 180 generates voltage increases and decreases from the normal supply voltage setpoint of supply 177.

FIG. 3 shows a representative power supply voltage waveform of the device under test, DUT 105, operating in a normal functional or operational mode. In such a normal operational mode, DUT 105 may exercise its internal circuitry much differently than during the test mode of the ABIST, LBIST or AVP testing operations. FIG. 3 depicts representative worst-case heavy workload noise level power supply voltages during the normal operational mode. In other words, FIG. 3 shows a Vworst waveform during high noise level normal mode functional operation. The maximum and minimum level of the Vworst voltage waveform of FIG. 3 represents the noise level of the worst case normal operational mode of DUT 105. The difference between the bracketed maximum level, Vmax_worst, of the Vworst waveform and the minimum level, Vmin_worst, of the Vworst waveform corresponds to a Vnoise_worst value as shown in FIG. 3. The value Vnoise_worst represents the noise that functional operations induce in the normal operation mode as a result of the real operation of DUT 105. In one embodiment, manufacturing system test controller 175 adds the Vnoise_worst value to any voltage minimum equations to generate a valid safe operating minimum voltage for DUT 105. For example, EQUATION 2 below represents the worst case normal operational mode voltage calculations for DUT 105. By adding the Vnoise_ worst value to EQUATION 1 above, the resultant true Vmin calculation is shown below.

$$Vmin = MAX(VminABISTcir, VminLBISTcir, VminAVPcir) + Vnoise\_worst \quad \text{EQUATION 2}$$

During test mode, each test, namely ABIST, LBIST and AVP, may induce power supply noise at different levels than the other tests. Each test may also produce power supply noise at different levels than the worst case normal operational mode of DUT 105. More particularly, power supply noise levels that test programs induce are unique and should be taken into account separately from the worst case functional noise value of Vnoise_worst in the normal operational mode. Manufacturing system test controller 175 utilizes the calculations of EQUATION 3 below to generate values for VminABIST, VminLBIST, and VminAVP. As seen in EQUATION 3 below, the minimum operating voltage seen as VminABIST is equal to the ABIST circuit voltage shown as VminABISTcir plus the power supply noise level voltage VnoiseABIST. In test mode, the ABIST program induces the noise level voltage shown as VnoiseABIST in EQUATIONS 3 below. Moreover, DUT power system controller 180 determines VnoiseABIST by measurement at power supply input voltage 177. The minimum operating voltage, shown as VminLBIST is equal to the voltage shown as VminLBISTcir plus any power supply noise VnoiseLBIST that the LBIST program may induce in test mode. DUT power system controller 180 determines VnoiseLBIST by measurement at power supply 177. As shown in EQUATIONS 3 below, the minimum operating voltage VminAVP is equal to the voltage seen as VminAVPcir plus the power supply noise VnoiseAVP that the AVP program may induce. Moreover, DUT power system controller 180 determines VnoiseAVP by measurement at power supply input voltage 177

$$VminABIST = VminABISTcir + VnoiseABIST$$

$$VminLBIST = VminLBISTcir + VnoiseLBIST$$

$$VminAVP = VminAVPcir + VnoiseAVP \quad \text{EQUATION 3}$$

VnoiseTEST represents a generic power supply voltage noise reference for one of three test programs of test programs 172 that operate within DUT 105. If test controller 170 runs the ABIST test program and manufacturing system test controller 175 evaluates a voltage noise value for that test, then the value of VminTest equals VnoiseABIST. Moreover, if test controller 170 runs the LBIST test program and manufacturing system test controller 175 calculates a voltage noise value, then VminTest equals VnoiseLBIST. If test controller 170 runs the AVP test program and manufacturing system test controller 175 calculates a voltage noise value, then the value of VminTest equals VnoiseAVP. By substituting the resultant calculations of EQUATION 3 into EQUATION 2 the resulting minimum power supply input voltage requirement shown as Vmin for DUT 105 is seen as EQUATION 4 below.

$$Vmin = MAX(VminABIST - VnoiseABIST, VminLBIST - VnoiseLBIST, VminAVP - VnoiseAVP) + Vnoise\_worst) \quad \text{EQUATION 4}$$

wherein Vnoise_worst is shown in FIG. 3 as described above.

VminTEST represents a generic voltage reference for one of three test programs of test programs 172 operating within DUT 105. If test controller 170 runs the ABIST test program and manufacturing system test controller 175 evaluates a voltage minimum value for that test, then the value of VminTest equals VminABIST. Moreover, if test controller 170 runs the LBIST test program and manufacturing system test controller 175 calculates a voltage minimum value, then VminTest equals VminLBIST. Similarly, if test controller 170 runs the AVP test program and manufacturing system test controller 175 calculates a voltage minimum value then the value of VminTest equals VminAVP. A more accurate definition of Vmin should take into account the power supply noise level that functional operations induce in the normal operation mode of DUT 105, namely the Vnoice_worst value. By further adding the Vnoise_worst value to each term within the parenthesis of EQUATION 4, the equivalent value of Vmin is shown in EQUATION 5 below.

$$Vmin = MAX(VminABIST + Vnoise\_worst - VnoiseABIST, VminLBIST + Vnoise\_worst - VnoiseLBIST, VminAVP + Vnoise\_worst - VnoiseAVP) \quad \text{EQUATION 5}$$

EQUATION 5 above represents the adjustment voltage constants namely Vnoise_worst−VnoiseABIST for the ABIST test, Vnoise_worst−VnoiseLBIST for the LBIST test and Vnoise_worst−VnoiseAVP for the AVP test. In one embodiment, the adjustment voltage constants for each test are necessary to determine the true minimum operating voltage for power supply input to DUT 105. EQUATIONS 6 below represents three adjustment voltage constant equations for each of three test programs, namely ABIST, LBIST, and AVP. Depending upon the particular adjustment voltage constant that manufacturing system test controller 175 currently calculates, VadjTEST of Equation 6A represents the adjustment voltage constant value of one of three constants namely, VadjABIST, VadjLBIST, or VadjAVP. The versions of each test program ABIST, LBIST and AVP are shown generically in EQUATION 6A below as VadjTEST=Vnoise_worst−VnoiseTEST. Each of three tests ABIST, LBIST, and AVP can substitute into the term TEST of Equation 6A to form the bottom three calculations of Vadj below in EQUATIONS 6B, 6C and 6D.

| | |
|---|---|
| {VadjTEST = Vnoise_worst − VnoiseTEST} | EQUATION 6A |
| VadjABIST = Vnoise_worst − VnoiseABIST | EQUATION 6B |
| VadjLBIST = Vnoise_worst − VnoiseLBIST | EQUATION 6C |
| VadjAVP = Vnoise_worst − VnoiseAVP | EQUATION 6D |

The relationship between minimum voltage level during test mode and power supply noise level during test mode for worst case and voltages under ABIST, LBIST and AVP test are identical. EQUATIONS 7 below describes the result of substituting the noise level parameters of EQUATIONS 6 with minimum voltage levels. EQUATIONS 7 represent an additional calculation for the adjustment voltage constants for ABIST, LBIST, and AVP. FIG. 7A shows the generic version of the VadjTest determination as VadjTEST=Vmin_worst−VminTEST. Each of three tests ABIST, LBIST, and AVP can substitute the terms ABIST, LBIST or AVP respectively into the term TEST to form the bottom three calculations below in EQUATIONS 7B, 7C and 7D.

| | |
|---|---|
| {VadjTEST = Vmin_worst − VminTEST} | EQUATION 7A |
| VadjABIST = Vmin_worst − VminABIST | EQUATION 7B |
| VadjLBIST = Vmin_worst − VminLBIST | EQUATION 7C |
| VadjAVP = Vmin_worst − VminAVP | EQUATION 7D |

Substituting the adjustment voltage constant equations from EQUATION 6 above into the minimum operating voltage equation of EQUATION 5 results in a final minimum voltage calculation shown in EQUATION 8 below.

$$V\text{min}=\text{MAX}(V\text{minABIST}+V\text{adjABIST}, V\text{minLBIST}+V\text{adjLBIST}, V\text{minAVP}+V\text{adjAVP}) \quad \text{EQUATION 8}$$

Generating the VadjABIST, VadjLBIST, and VadjAVP values represents one aspect of the disclosed methodology and test system apparatus. Moreover, the flowcharts of FIGS. 4-6 below respectively show three methods for determining the adjustment voltage constants of EQUATIONS 6 and EQUATIONS 7 Manufacturing system test controller 175 uses each method to further establish a more realistic representation of the true minimum power supply voltage that DUT power system controller 180 supplies to DUT 105 with power supply 177 in a functional operating state, namely operating in normal mode. Moreover, manufacturing system test controller 175 may combine the methodologies disclosed below by using one or more of the disclosed methods in combination to further establish a safe input supply voltage for operation of DUT 105.

Figure 4:
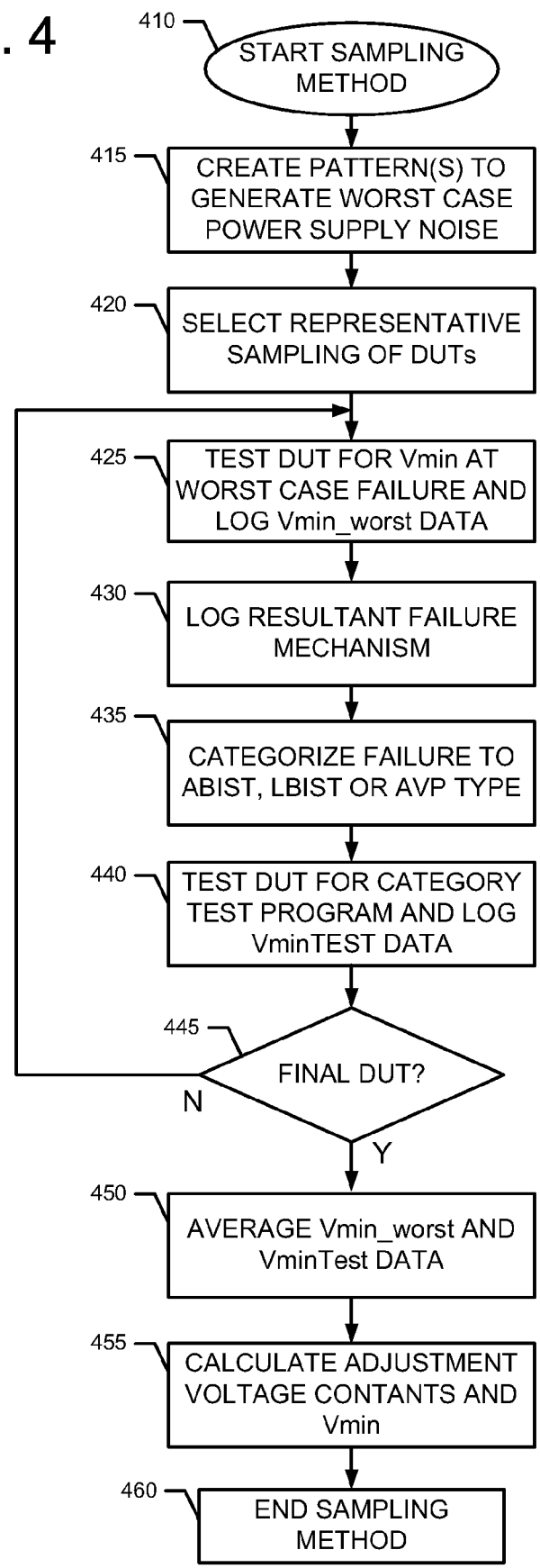
FIG. 4 is a flow chart that depicts the determination of minimum operating voltages for a DUT using device sampling in accordance with the disclosed methodology.

FIG. 4 is a flowchart that depicts a DUT sampling method for developing the adjustment voltage constants shown in EQUATION 6 and EQUATION 7 above. The DUT sampling method begins at start block 410. Using built-in test capability, test controller 170 creates a pattern or patterns to generate worst case power supply noise during the functional operation of DUT 105, as per block 415. More specifically, test controller 170 generates a pattern of digital 1's and 0's as input to various nodes within DUT 105. The manufacturing system test controller 175 selects a representative sampling of circuits for use as DUTs, as per block 420. Test controller 170 generates the worst case supply noise test pattern until DUT failure and determines the minimum failure input power supply voltage, Vworst, and the corresponding minimum operating voltage level value, Vmin_worst, at the moment of failure, as per block 425. Vworst, as per FIG. 3, represents the power supply input voltage response of DUT 105 during worst case functional operation, namely worst case normal mode operation. Vmin_worst represents the minimum voltage at the moment of failure of the DUT 105. Vnoise_worst represents the voltage noise level from DUT power system controller 180 at the power supply voltage input during the worst case functional pattern. Manufacturing system test controller 175 stores in its memory (not shown) the Vmin_worst data result for each DUT. Manufacturing system test controller 175 then determines the reason for the test failure and logs the resultant failure mechanism, as per block 430. Moreover, manufacturing system test controller 175 analyzes the failure mechanism and categorizes the area of failure, namely which test program best represents the type of failure, as per block 435. More particularly, manufacturing system test controller 175 categorizes the failure mechanism of DUT 105 as ABIST, LBIST, or AVP type failures.

Manufacturing system test controller 175 uses the category type from block 435 to perform a test from among ABIST, LBIST or AVP tests of DUT 105, namely the test which type fits the category type, as per block 440. For example, if the category failure test of block 435 results in an ABIST type, then the test type per block 440 is ABIST also. The ABIST test will provide the automated built-in self-test for array functions of DUT 105. If the category type is LBIST, such as in the case of a logic function, then manufacturing system test controller 175 will initiate an LBIST test and log the VminTest data. In another example, if manufacturing system test controller 175 can not determine the failure cause to be in an ABIST or LBIST area, manufacturing system test controller 175 will perform an architecture verification program AVP.

Manufacturing system test controller 175 logs the voltage data of the VminTEST in preparation for the test of block 440. More particularly, manufacturing system test controller 175 logs the resultant minimum voltage data for the test program in use, namely VminABIST, VminLBIST, or VminAVP. The manufacturing system test controller 175 performs a test to determine if the representative sampling and testing of DUTs is complete, as per decision block 445. If the test of decision block 445 returns a false result, operational flow returns to block 425 and testing continues. However, if the test of decision block 445 returns a true result, then testing is complete and manufacturing system test controller 175 averages the log results of Vmin_worst and VminTest data from previous tests, as per block 450 The manufacturing system test controller 175 averages the results corresponding to each Vmin_worst test value as shown in the test DUT for Vmin block 425 operation. Further, manufacturing system test controller 175 averages the VminTEST data of one test among VminABIST, VminLBIST, or VminAVP data as shown by category in the test per block 440 calculation. Manufacturing system test controller 175 then calculates the adjustment voltage constants and Vmin, as per block 455. Moreover, manufacturing system test controller 175 uses the calculations shown in EQUATION 7 above, namely VadjTEST=Vmin_worst−VminTEST, to evaluate the adjustment voltage constant for this group of DUTs. Manufacturing system test controller 175 evaluates the adjustment voltage constant for a specific test program, namely ABIST, LBIST, or AVP, with this methodology. Manufacturing system test controller 175 then calculates the minimum voltage Vmin per EQUATION 8 for input power supply voltage, again as per block 455. The test program of the DUT sampling method completes, as per end block 460.

Figure 5:
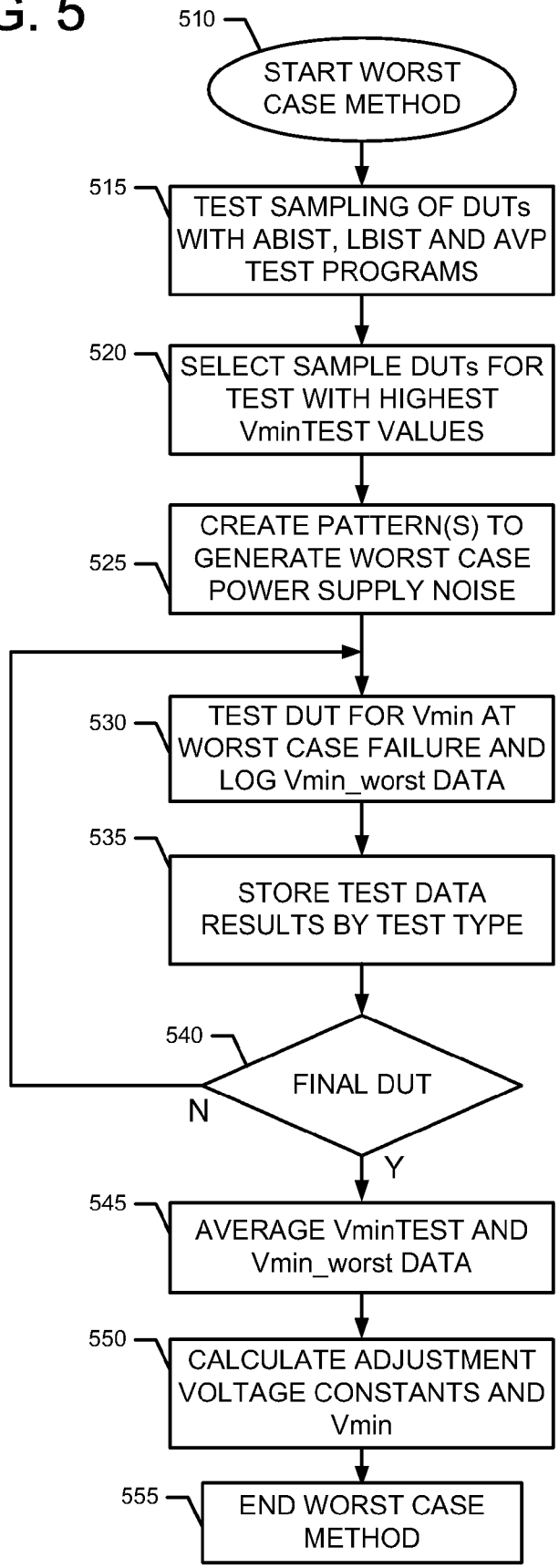
FIG. 5 is a flow chart that depicts the determination of minimum operating voltages for a DUT using worst case device testing in accordance with the disclosed methodology.

FIG. 5 is a representative flowchart depicting another method for developing the adjustment voltage constants as shown in EQUATION 6 and EQUATION 7 above. A worst case noise method begins at start block 510. Manufacturing system test controller 175 tests a sampling of devices under test such as DUT 105 with the built-in test program capability of test controller 170, as per block 515. Test controller 170 initiates ABIST, LBIST and AVP test programs on the same sampling of DUTs. Within the test sampling, manufacturing system test controller 175 selects a smaller group of DUTs wherein the test results exhibit the highest value for the minimum voltage parameter VminTEST for each of ABIST, LBIST, and AVP, as per block 520. Within this new group of DUTs, test controller 170 creates a pattern or patterns to generate worst case power supply noise during the functional operation of DUT 105, as per block 525.

Test controller 170 runs the worst case supply noise test pattern until DUT failure and determines the supply voltage of Vworst and thus, minimum voltage level parameter Vmin_worst at the moment of failure, as per block 530. Vworst, as per FIG. 3, represents the voltage response of DUT 105 during worst case power supply input noise level functional operation during normal made. Vmin_worst represents the minimum power supply input voltage at moment of failure of DUT 105. Vnoise_worst represents the voltage noise level from power supply 177 at the power supply voltage input to DUT 105 during the worst case pattern test.

Manufacturing system test controller 175 stores the Vmin_worst data result for each DUT and sorts the results by test type namely ABIST, LBIST, or AVP, as per block 535. The manufacturing system test controller 175 performs a test to determine if the representative sampling and testing of DUTs is complete, as per decision block 540 If the test of decision block 540 returns a false result, operational flow returns to block 530 and testing continues. However, if the test of decision block 540 returns a true result, then testing is complete for the representative group of DUTs, and manufacturing system test controller 175 averages the log results of VminTEST and Vmin_worst data from previous tests, as per block 545. The manufacturing system test controller 175 averages the results corresponding to each VminTEST value among VminABIST, VminLBIST, or VminAVP data as shown in the select sample DUTs block 520 operation. Further, manufacturing system test controller 175 averages the Vmin_worst data of each Vmin test per block 530. Manufacturing system test controller 175 then calculates the adjustment voltage constants and Vmin, as per block 550. Moreover, manufacturing system test controller 175, using calculations shown in EQUATION 7 above namely VadjTEST=Vmin_worst−VminTEST, evaluates the adjustment voltage constant for this group of DUTs. Manufacturing system test controller 175 evaluates the adjustment voltage constant for each test program independently, namely ABIST, LBIST, or AVP with the disclosed methodology. Manufacturing system test controller 175 then calculates the minimum input power supply voltage Vmin as shown in EQUATION 8 above again, as per block 550. The worst case noise method completes, per end block 555.

Figure 6:
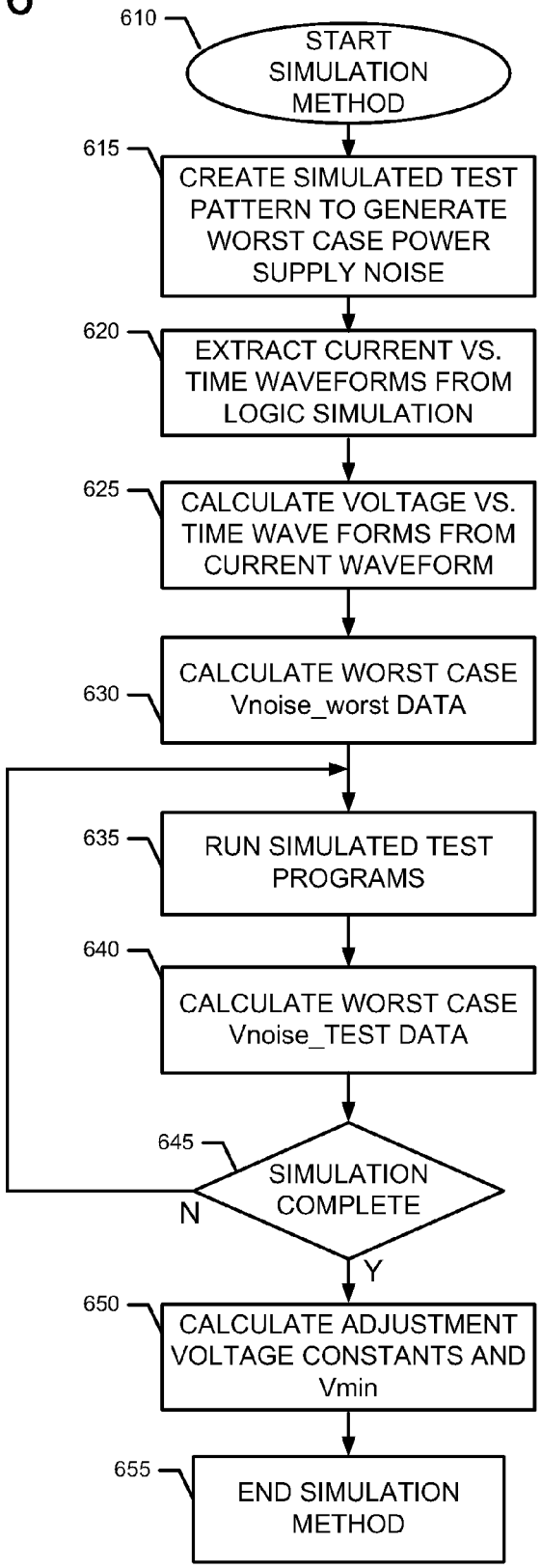
FIG. 6 is a flow chart that depicts the determination of minimum operating voltages for a DUT using device simulation in accordance with the disclosed methodology.

FIG. 6 is a flowchart that depicts another method for developing the adjustment voltage constants as shown in EQUATION 6 and EQUATION 7 above. Logic simulation uses circuit modeling and software simulation of circuit functions to emulate real life devices. In test system 100, logic simulator 185 employs computer program modeling of each node and discrete element of a DUT to provide an accurate software model of the entire circuit of the DUT. Logic simulator 185 can inject or write software simulation test patterns into the modeled device (DUT) and moreover may predict the response of each node of such a circuit model. Logic simulator 185 generates input power supply simulations as well as input signal simulations. A programmer may generate a software model of any typical circuit. Moreover, for purposes of this disclosed embodiment, device under test DUT 105 may be a full software circuit device model.

Simulation method of DUT 105 begins with initiation of logic simulator 185 at start block 610. Logic simulator 185 creates a test pattern to generate worst case power supply noise for DUT 105, as per block 615. Logic simulator 185 may generate random test patterns for analysis or rely on previous real life test patterns with known results. The logic simulator 185 extracts a waveform of current over time for each node, discrete transistor, device element, or logic function in the simulation of DUT 105. Moreover, the current waveform is relative to the worst case supply voltage noise test pattern, as per block 620. Logic simulator 185 calculates voltage over time waveform data from the current waveform over time data for each device node or element under analysis, as per block 625. Calculating the Vnoise_worst data is a result of the logic simulator 185 analyzing the power supply voltage during the worst case supply voltage pattern test, as per block 630. Logic simulator 185 also simulates the test patterns necessary to emulate test programs namely ABIST, LBIST and AVP in the DUT 105 circuit model, as per block 635.

Logic simulator 185 emulating manufacturing system test controller 175 calculates worst case noise data for the current test program as Vnoise_TEST data, as per block 640. Logic simulator 185 performs a test to determine if all test programs are complete, as per decision block 645. In one embodiment, logic simulator 185 may run only a single test such as ABIST, or a combination including any of three tests namely ABIST, LBIST, or AVP. If the test of decision block 645 returns a false result, operational flow returns to block 635 and testing continues. However, if the test of decision block 645 returns a true result, then testing is complete wherein all test program emulations are done and the logic simulator 185 then calculates the adjustment voltage constants and Vmin, as per block 650. Using the calculations of EQUATION 6 namely VadjTEST=Vnoise_worst−VnoiseTEST, logic simulator 185 emulating manufacturing system test controller 175 calculates the adjustment voltage constants for each test run during the simulation. Logic simulator 185 typically calculates the adjustment voltage constants for ABIST, LBIST and AVP simulation data and uses the data in EQUATION 8 above to calculate Vmin. The simulation test program completes, as per end block 655.

The foregoing discloses methodologies wherein Vmin becomes a direct calculation using the data resulting from the methods or combinations of methods disclosed. Each methodology provides for the generation of adjustment voltage constants and voltage test minimum values. More particularly, adjustment voltage constants include adjABIST, VadjLBIST, and VadjAVP, wherein voltage minimum data values include VminABIST, VminLBIST, and VminAVP. In one embodiment, manufacturing system test controller 175 determines the minimum functional input supply voltage shown as Vmin using the relationships in EQUATION 8 above and the data from the disclosed methodologies above.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method for determining the minimum operating voltage of a device under test (DUT), the method comprising:
supplying voltage, by a power supply, to the DUT;
supplying, by a clock circuit, a clock signal exhibiting a predetermined frequency to the DUT;
varying, by a controller coupled to the power supply, the voltage of the power supply from a predetermined voltage value to lower and lower voltage values;
testing, by an internal test controller during the varying step, with a first test to determine a first minimum voltage at which the DUT successfully operates at the predetermined frequency; and
testing, by an external test controller during the varying step, with a second test to determine a second minimum voltage at which the DUT successfully operates at the predetermined frequency.

2. The method of claim 1, further comprising:
selecting the lower of the first minimum voltage determined in the internal testing step and the second minimum voltage determined in the external testing steps as the minimum operating voltage of the DUT.

3. The method of claim 1, wherein the first test by the internal test controller is an ABIST test.

4. The method of claim 1, wherein the first test by the internal test controller is an LBIST test.

5. The method of claim 1, wherein the second test by the external test controller is an AVP test.

6. The method of claim 1, wherein the predetermined frequency of the clock signal is fixed.

7. The method of claim 1, wherein the first test by the internal test controller includes an ABIST test and an LBIST test, and the second test by the external test controller includes an AVP test; the method further comprising:

selecting a minimum voltage Vmin according to the relationship:

$$Vmin=MAX(VminABISTcir, VminLBISTcir, VminAVPcir)$$

wherein VminABISTcir is a voltage corresponding to a lowest passing voltage of the ABIST test, VminLBISTcir is a voltage corresponding to a lowest passing voltage of the LBIST test, VminAVPcir is a voltage corresponding to a lowest passing voltage of the AVP test, and MAX is the largest of VminABISTcir, VminLBISTcir and VminAVPcir.

8. The method of claim 7, further comprising:
selecting a minimum voltage Vmin for the DUT according to the relationship:

$$Vmin=MAX(VminABISTcir, VminLBISTcir, VminAVPcir)+Vnoise\_worst$$

wherein Vnoise_worst is the difference between a maximum and a minimum amount of noise in the voltage of the power supply.

9. The method of claim 8, further comprising:
selecting respective minimum voltages for the ABIST, LBIST and AVP tests according to the relationships:

$$VminABIST=VminABISTcir+VnoiseABIST$$

$$VminLBIST=VminLBISTcir+VnoiseLBIST$$

$$VminAVP=VminAVPcir+VnoiseAVP$$

wherein VminABIST is a minimum voltage corresponding to the ABIST test and VnoiseABIST is a noise value associated with the ABIST test, VminLBIST is a minimum voltage corresponding to the LBIST test and VnoiseLBIST is a noise value associated with the LBIST test, and VminAVP is a minimum voltage corresponding to the AVP test and VnoiseAVP is a noise value associated with the AVP test.

10. The method of claim 9, further comprising:
selecting a minimum voltage Vmin for the DUT according to the relationship:

$$Vmin=MAX(VminABIST+Vnoise\_worst-VnoiseABIST, VminLBIST+Vnoise\_worst-VnoiseLBIST, VminAVP+Vnoise\_worst-VnoiseAVP).$$

11. The method of claim 10, further comprising:
selecting a minimum voltage Vmin for the DUT according to the relationship:

$$Vmin=MAX(VminABIST+VadjABIST, VminLBIST+VadjLBIST, VminAVP+VadjAVP)$$

wherein VadjABIST, VadjLBIST, and VadjAVP correspond to noise adjustment terms for the ABIST, LBIST and AVP test respectively, thus providing a more accurate lowest voltage, Vmin, at which the DUT may safely operate.

12. A test system for determining the minimum operating voltage of a device under test (DUT), the test system comprising:

a power supply that couples to the DUT and supplies voltage to the DUT;

a clock circuit that couples to the DUT and supplies a clock signal exhibiting a predetermined frequency to the DUT;

a controller that couples to the power supply and varies the voltage of the power supply from a predetermined voltage value to lower and lower voltage values;

an internal test controller, situated in the DUT, that conducts a first test to determine a first minimum voltage at which the DUT successfully operates at the predetermined frequency while the controller varies the voltage of the power supply; and an external test controller, coupled to the internal test controller, that conducts a second test to determine a second minimum voltage at which the DUT successfully operates at the predetermined frequency.

13. The test system of claim 12, wherein the external test controller selects the lower of the first minimum voltage that the internal controller determines and the second minimum voltage that the external controller determines as the minimum operating voltage of the DUT.

14. The test system of claim 12, wherein the first test by the internal test controller is one of an ABIST test and an LBIST test.

15. The test system of claim 12, wherein the second test by the external test controller is an AVP test.

16. The test system of claim 12, wherein the first test by the internal test controller includes an ABIST test and an LBIST test, and the second test by the external test controller includes an AVP test; wherein the external controller selects a minimum voltage Vmin according to the relationship:

$$Vmin=MAX(VminABISTcir, VminLBISTcir, VminAVPcir)$$

wherein VminABISTcir is a voltage corresponding to a lowest passing voltage of the ABIST test, VminLBISTcir is a voltage corresponding to a lowest passing voltage of the LBIST test, VminAVPcir is a voltage corresponding to a lowest passing voltage of the AVP test, and MAX is the largest of VminABISTcir, VminLBISTcir and VminAVPcir.

17. The test system of claim 16, wherein the external controller selects a minimum voltage Vmin for the DUT according to the relationship:

$$Vmin=MAX(VminABISTcir, VminLBISTcir, VminAVPcir)+Vnoise\_worst$$

wherein Vnoise_worst is the difference between a maximum and a minimum amount of noise in the voltage of the power supply.

18. The test system of claim 17, wherein the external controller selects respective minimum voltages for the ABIST, LBIST and AVP tests according to the relationships:

$$VminABIST=VminABISTcir+VnoiseABIST$$

$$VminLBIST=VminLBISTcir+VnoiseLBIST$$

$$VminAVP=VminAVPcir+VnoiseAVP$$

wherein VminABIST is a minimum voltage corresponding to the ABIST test and VnoiseABIST is a noise value associated with the ABIST test, VminLBIST is a minimum voltage corresponding to the LBIST test and VnoiseLBIST is a noise value associated with the LBIST test, and VminAVP is a minimum voltage corresponding to the AVP test and VnoiseAVP is a noise value associated with the AVP test.

19. The test system of claim 18, wherein the external controller selects a minimum voltage Vmin for the DUT according to the relationship:

$$Vmin = MAX(VminABIST + Vnoise\_worst - VnoiseABIST, VminLBIST + Vnoise\_worst - VnoiseLBIST, VminAVP + Vnoise\_worst - VnoiseAVP).$$

20. The test system of claim 19, further comprising:
selecting a minimum voltage Vmin for the DUT according to the relationship:

$$Vmin = MAX(VminABIST + VadjABIST, VminLBIST + VadjLBIST, VminAVP + VadjAVP)$$

wherein VadjABIST, VadjLBIST, and VadjAVP correspond to noise adjustment terms for the ABIST, LBIST and AVP test respectively, thus providing a more accurate lowest voltage, Vmin, at which the DUT may safely operate.

* * * * *